(12) United States Patent
Javorka et al.

(10) Patent No.: US 8,828,816 B2
(45) Date of Patent: Sep. 9, 2014

(54) PMOS THRESHOLD VOLTAGE CONTROL BY GERMANIUM IMPLANTATION

(75) Inventors: Peter Javorka, Radeburg (DE); Stephan Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 431 days.

(21) Appl. No.: 13/115,428

(22) Filed: May 25, 2011

(65) Prior Publication Data

US 2012/0302023 A1 Nov. 29, 2012

(51) Int. Cl.

| H01L 21/336 | (2006.01) |
|---|---|
| H01L 29/66 | (2006.01) |
| H01L 29/778 | (2006.01) |
| H01L 21/8238 | (2006.01) |
| H01L 21/265 | (2006.01) |
| H01L 29/78 | (2006.01) |
| H01L 29/165 | (2006.01) |

(52) U.S. Cl.
CPC ...... *H01L 29/7781* (2013.01); *H01L 29/66537* (2013.01); *H01L 29/165* (2013.01); *H01L 29/6659* (2013.01); *H01L 21/823807* (2013.01); *H01L 21/26506* (2013.01); *H01L 29/7833* (2013.01)
USPC .................... 438/199; 438/285; 257/E21.409

(58) Field of Classification Search
USPC .................................. 438/285, 473, 528, 486
See application file for complete search history.

(56) References Cited

U.S. PATENT DOCUMENTS

| 5,137,838 A | 8/1992 | Ramde et al. | |
|---|---|---|---|
| 5,879,996 A * | 3/1999 | Forbes | 438/289 |
| RE37,158 E | 5/2001 | Lee | |
| 6,709,935 B1 | 3/2004 | Yu | |
| 7,094,671 B2 | 8/2006 | Li | |
| 7,312,137 B2 | 12/2007 | Li | |
| 7,394,111 B2 | 7/2008 | Forbes | |
| 7,488,670 B2 * | 2/2009 | Knoefler et al. | 438/473 |
| 7,491,586 B2 | 2/2009 | Horch et al. | |
| 7,737,009 B2 | 6/2010 | Lindsay et al. | |
| 7,898,028 B2 | 3/2011 | Chang et al. | |
| 8,017,487 B2 * | 9/2011 | Chong et al. | 438/300 |
| 2006/0014396 A1 * | 1/2006 | Chen et al. | 438/757 |
| 2006/0141724 A1 * | 6/2006 | Kim | 438/301 |
| 2009/0068824 A1 * | 3/2009 | Liu et al. | 438/530 |
| 2011/0133276 A1 * | 6/2011 | Thei et al. | 257/337 |
| 2012/0299121 A1 * | 11/2012 | Wu et al. | 257/408 |

* cited by examiner

*Primary Examiner* — Savitr Mulpuri

(74) *Attorney, Agent, or Firm* — Amerson Law Firm, PLLC

(57) ABSTRACT

Disclosed herein is a method of forming a semiconductor device. In one example, the method comprises forming a P-active region in a silicon containing semiconducting substrate, performing an ion implantation process to implant germanium into the P-active region to form an implanted silicon-germanium region in the P-active region, and forming a gate electrode structure for a PMOS transistor above the implanted silicon-germanium region.

12 Claims, 3 Drawing Sheets

PMOS THRESHOLD VOLTAGE CONTROL BY GERMANIUM IMPLANTATION

BACKGROUND OF THE INVENTION

1. Field of the Invention

Generally, the present disclosure generally relates to the manufacturing of sophisticated semiconductor devices, and, more specifically, to a process flow whereby germanium is implanted to control the threshold voltage of PMOS devices.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS or NMOSs) and/or P-channel transistors (PMOS or PMOSs), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel length may be restricted to high-speed signal paths, whereas transistor elements with a longer channel length may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include so-called high-k materials (k value greater than 10) that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and, thus, the threshold voltages in a very advanced process stage.

It turns out, however, that the manufacturing variations in the threshold adjusting semiconductor alloy may have a significant influence on threshold variability and other transistor characteristics, as will be described in more detail with reference to FIG. 1. FIG. 1 depicts an illustrative prior art device 100 that is generally comprised of a partially formed NMOS transistor 100N and a partially formed PMOS transistor 100P formed in and above a semiconducting substrate 10. The illustrative transistors 100N, 100p are separated by an illustrative isolation structure 12, e.g., a shallow trench isolation structure, formed in the substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration.

At the stage of manufacture depicted in FIG. 1, the transistors 100N, 100P are each comprised of a gate structure 20 and source/drain regions 30. The gate structure 20 may include a gate insulation layer 22, a high-k insulation layer 24, a gate electrode 26 and sidewall spacers 28. The gate electrode may be made of a variety of materials, such as lanthanum (for the NMOS transistor 100N) and aluminum (for the PMOS transistor 100P). In some cases, the PMOS transistor 100P may have an additional work function layer 25, such as titanium nitride, that may not be present in the NMOS transistor 100N. Typically, during the formation of the PMOS transistor 100P, a layer of semiconductor material 32, e.g., silicon germanium, is selectively grown on the active layer 10C in the P-active region where the PMOS transistor 100P will be formed in an attempt to control the threshold voltage of the PMOS transistor 100P, and thereby enhance the performance and controllability of the PMOS transistor 100P. Typically, the semiconductor material 32 is not formed for the NMOS transistor 100N. Prior to selectively growing the layer of semiconductor material 32 for the PMOS transistors 100P, one or more etching and masking process may be performed such that only the portions of the active layer 10C where PMOS transistors 100P will be formed are exposes to the selective deposition process, e.g., a selective epitaxial deposition process. Unfortunately, the processes used to form the semiconductor material 32, e.g., an epitaxial growth/deposition process, are not precise enough as there is typically significant thickness variations in the regions of semiconductor material 32 formed across the substrate. For example, in the case where the target thickness of the semiconductor material 32 is 7 nm, the variation in the thickness of the semiconductor material 32 regions formed across the substrate 10 may be approximately +/−1.0-1.5 nm. This across-substrate thickness variation in the semiconductor material 32 may cause significant changes in the threshold voltage of the resulting PMOS transistor 100P, e.g., it may cause a shift in the threshold voltage of approximately +/−25-30 mV. As a result of various PMOS transistors 100P having different threshold voltage levels, because of the differences in thickness of the semiconductor material 32 for the various PMOS transistors 100P, the operation and controllability on the semiconductor device 100 is degraded The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a to a process flow whereby Germanium is implanted to control the threshold voltage of PMOS devices. In one example, the method comprises forming a P-active region in a silicon containing semiconducting substrate, performing an ion implantation process to implant germanium into the P-active region to form an implanted silicon-germanium region in the P-active region, and forming a gate electrode structure for a PMOS transistor above the implanted silicon-germanium region. In some embodiments the gate electrode material may be a metal or polysilicon.

A further illustrative method disclosed herein involves forming a P-active region and an N-active region in a silicon containing substrate, forming a masking layer that covers the N-active region and exposes at least a portion of the P-active region, forming an implantation screen layer on the exposed portion of the P-active region, performing an ion implantation process through the implantation screen layer to implant germanium into the P-active region to form an implanted silicon-germanium region in the P-active region, and forming a gate electrode structure for a PMOS transistor above the implanted silicon-germanium region.

BRIEF DESCRIPTION OF THE DRAWINGS

The disclosure may be understood by reference to the following description taken in conjunction with the accompanying drawings, in which like reference numerals identify like elements, and in which.

Figure 1:
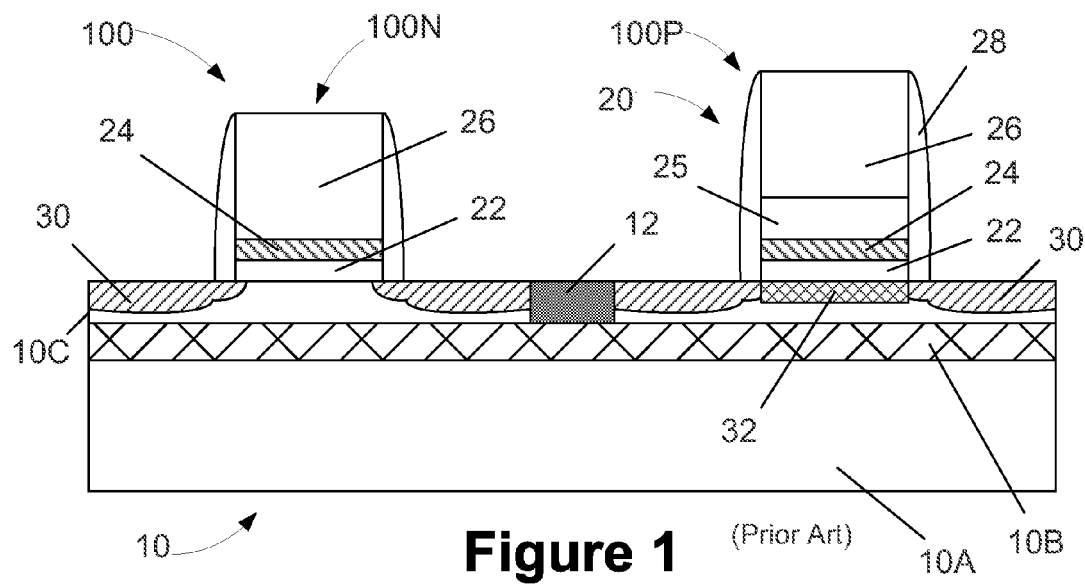
FIG. 1 schematically depicts an illustrative prior art semiconductor device that includes illustrative NMOS and PMOS transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to techniques that may be employed in forming sophisticated gate electrode structures for various integrated circuit devices while reducing or perhaps eliminating across-wafer variations in the threshold voltage of PMOS transistors. In some cases, the transistors may include a high-k dielectric material (k value greater than 10) and a metal-containing electrode material. As will be readily apparent to those skilled in the art upon a complete reading of the present application, the present method is applicable to a variety of technologies, and is readily applicable to a variety of devices, including, but not limited to, logic devices, memory devices, resistors, conductive lines, etc. With reference to FIGS. 2A-2F, further illustrative embodiments will now be described in more detail, wherein reference may also be made to FIG. 1, if required.

Figure 2A:
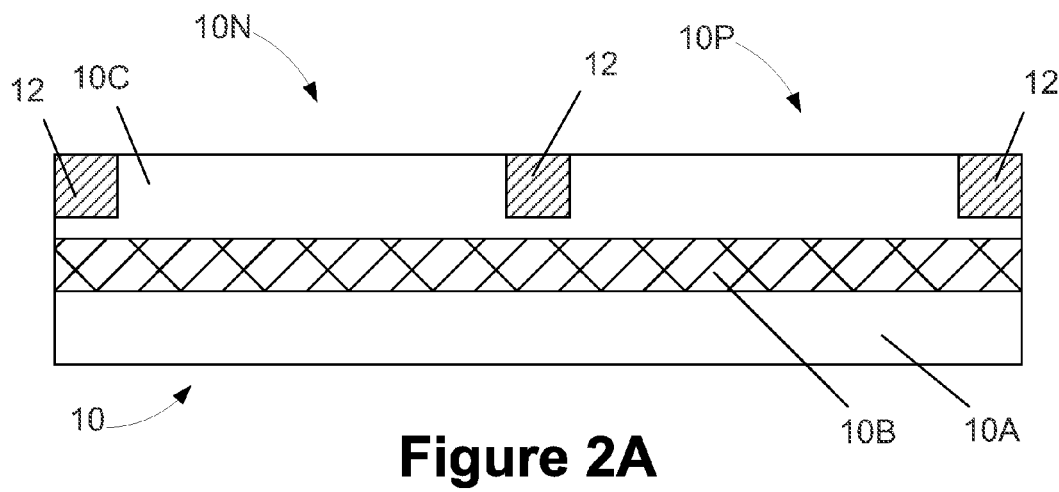
FIGS. 2A-2F depict one illustrative example of the novel process flow described herein.

FIG. 2A depicts an illustrative semiconducting substrate 10 that is generally comprised of an N-active region 10N, where an illustrative NMOS transistor will ultimately be formed, and a P-active region 10P, where an illustrative PMOS transistor will ultimately be formed. The NMOS and PMOS transistors will be formed in and above the active layer 10C of the semiconducting substrate 10. The illustrative active regions 10N, 10P are separated by illustrative isolation structures 12, e.g., a shallow trench isolation structure, formed in the substrate 10. In one illustrative embodiment, the semiconducting substrate 10 a silicon-on-insulator (SOI) substrate comprised of bulk silicon 10A, a buried insulation layer 10B (commonly referred to as a "BOX" layer 10B and an active layer 10C, which may also be a silicon material. Of course, the present invention is equally applicable to other configurations of the substrate 10. For example, the substrate 10 may be comprised of semiconducting materials other than silicon and/or it may be in another form, such as a bulk silicon configuration. Thus, the terms substrate or semiconductor substrate should be understood to cover all forms of semiconductor structures. At the stage of manufacture depicted in FIG. 2A, the N-active region 10N and the P-active region 10P have been defined by the formation of illustrative shallow trench isolation structures 12 in the active layer 10C of the substrate 10. The substrate 10 itself, and the isolation structures 12 may be formed using traditional techniques. For example, the isolation structures 12 may be formed by performing one or more etching and deposition processes, which are well known to those skilled in the art.

Figure 2B:
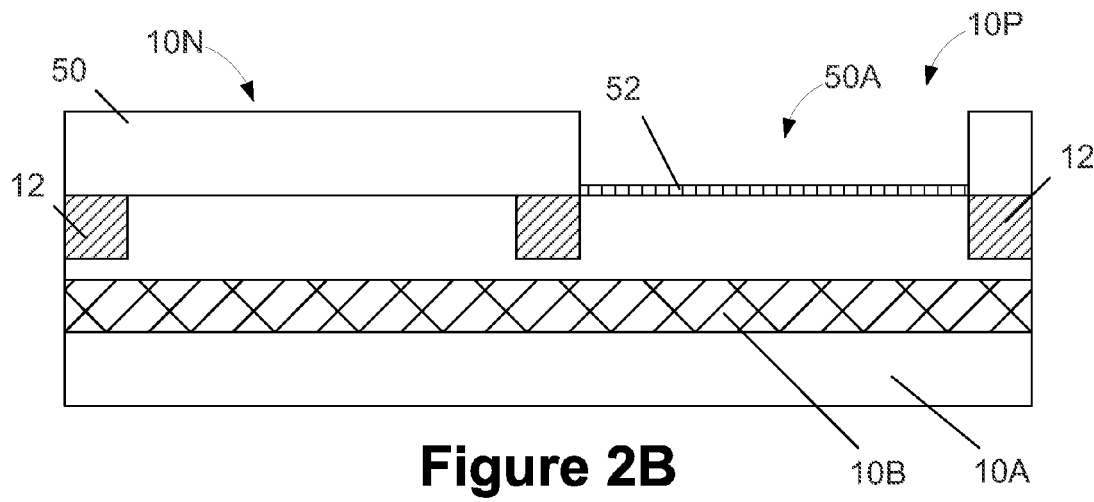

Next, as shown in FIG. 2B an illustrative masking layer 50, with a mask opening 50A, is formed above the substrate 10 to mask the N-active regions 10N and expose at least portions of the P-active regions 10P across the substrate for further processing. As will be discussed more fully below, the size of the mask opening 50A may vary depending upon the application or the desires of the device designer. In the illustrative example depicted in FIG. 2B, the mask opening 50A exposes substantially all of the P-active region 10P between the isolation structures 12 for further processing. The masking layer 50 may be comprised of a variety of materials, e.g., photoresist, silicon nitride, etc. The masking layer 50 may be formed by a variety of techniques, e.g., spin-coating, chemical vapor deposition (CVD), low pressure chemical vapor deposition (LPCVD), etc. In one illustrative embodiment, the masking layer 50 is a layer of photoresist that is formed using traditional photolithography techniques, e.g., spin-on coating, soft-bake, exposure, hard bake and develop, etc.

Also depicted in FIG. 2B is an illustrative implant screen layer 52 (also sometimes referred to as a "screen oxide" in the case where it is made from an oxide) formed on exposed active regions 10P. The implant screen layer 52 may be comprised of a variety of materials, e.g., silicon dioxide, etc., and it may be formed by a variety of techniques, e.g., chemical vapor deposition (CVD), low pressure chemical vapor deposition (LPCVD), thermal growth, etc. In one illustrative embodiment, the implant screen layer 52 is comprised of a thermally grown layer of silicon dioxide having a thickness ranging from approximately 1-3 nm.

Figure 2C:
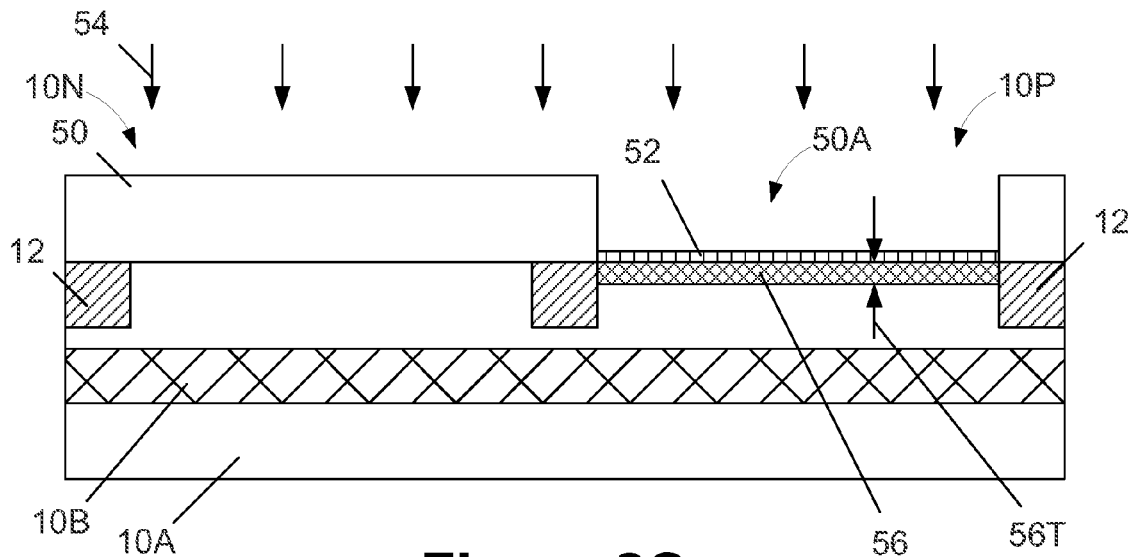
Figure 2D:
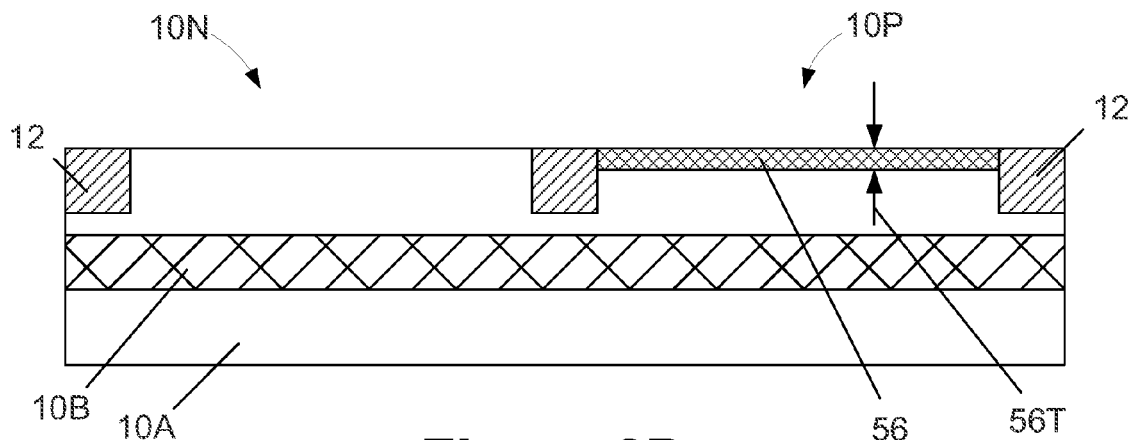

Next, as shown in FIG. 2C, an ion implantation process 54 is performed to implant Germanium into the P-active region 10P to form the Silicon-Germanium (SiGe) region 56 in the active layer 10C. In one illustrative embodiment, the implant process 54 is performed at an energy level ranging from 1-10

KeV, with an implant dosage that ranges from $1e^{14}$-$1e^{15}$ ions/cm$^2$ of Germanium. In one illustrative example, the Germanium implant region has an as-implanted thickness that ranges from approximately 3-10 nm. By implanting the Germanium ions the thickness uniformity of the implanted SiGe regions 56 formed across the substrate 10 may be more accurately controlled as compared the formation of the SiGe regions 32 depicted in FIG. 1 using prior art epitaxial deposition processes to form the SiGe regions 32 of the prior art. As a result, the threshold voltage of PMOS transistors formed above the implanted SiGe regions 56 is less variable and more controllable as compared to prior art devices. After the SiGe regions 56 have been formed the implant screen layer 52 may ultimately be removed and a gate insulation layer for the PMOS transistor (to be formed) may be formed above the implanted SiGe regions 56.

Ultimately, the implanted SiGe region 56 will be subjected to a heat treatment process to cure damage to the lattice structure of the active layer 10C. In one illustrative embodiment, the heat treatment may be performed at a temperature ranging from approximately 500-700 C, and even more specifically at a temperature of approximately 600 C, for a duration of approximately 4 minutes. For purposes of this application and the claims, it should be understood that the phrase "implanted SiGe region" or "implanted silicon-germanium region" refers to the same structure either before or after any heat treatment process is performed on such regions. Additionally, to the extent possible with the overall manufacturing process scheme, the heat treatment of the implanted SiGe region 56 may be performed in conjunction with or separate from other heat treatments performed during manufacturing. For example, the heat treatment process for the implanted SiGe region 56 may be performed in conjunction with one or more heat treatments process performed to activate dopant materials implanted to form source-drain regions.

Figure 2E:
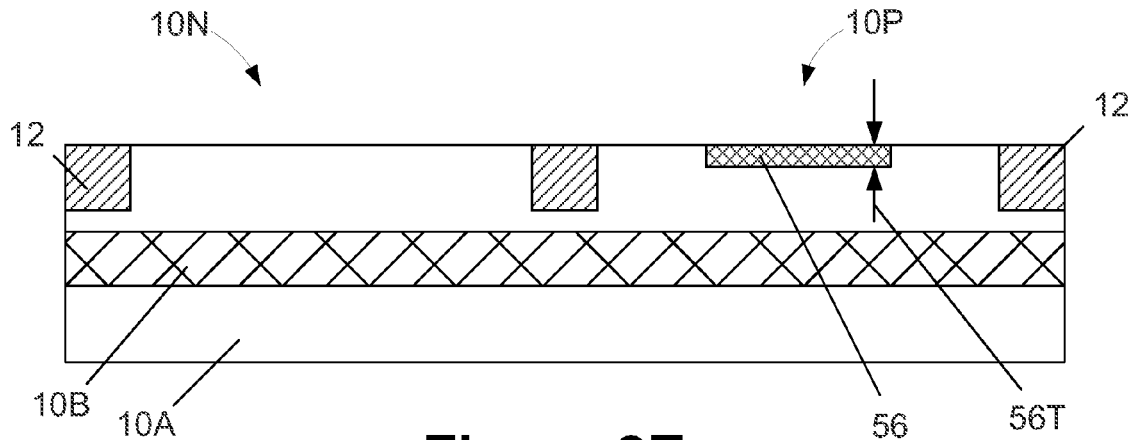
Figure 2F:
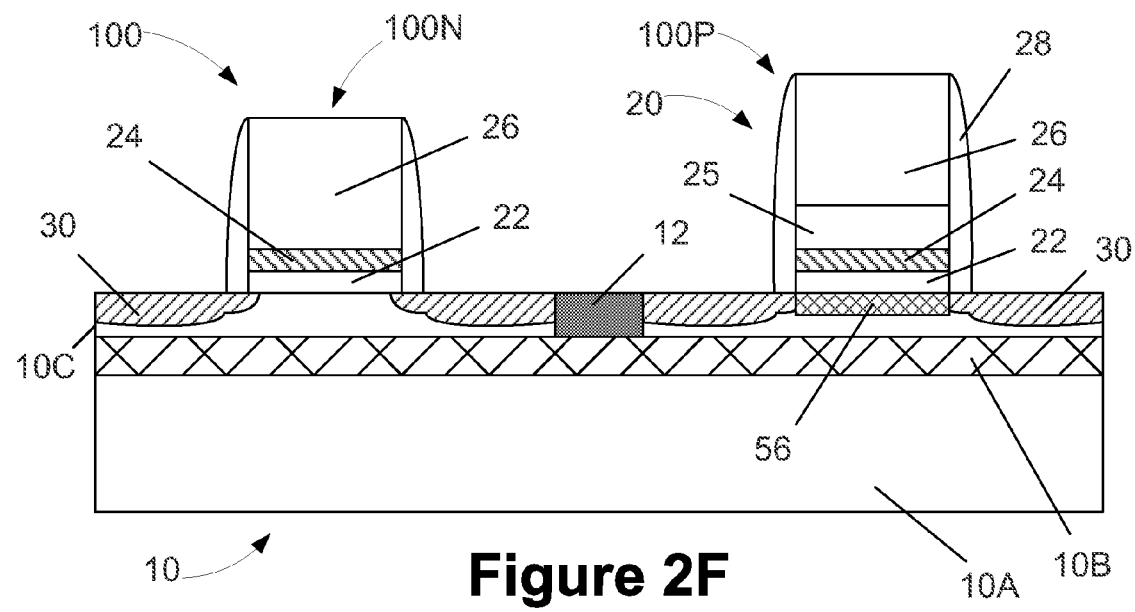

As reflected in FIG. 2F, after the implanted SiGe region 56 is formed, traditional processing operations may be performed to form illustrative NMOS and PMOS transistors 100N, 100P, wherein the implanted SiGe region 56 extends at least under the gate electrode structure 20 of the PMOS transistor 100P. As noted previously, the presence of the implanted SiGe regions 56 causes the threshold voltage of the PMOS transistors to be less variable and more controllable as compared to prior art devices that employed the silicon germanium regions 32 formed by performing a epitaxial deposition/growth process.

FIG. 2E depicts an alternative implementation of the present subject matter, wherein the implanted SiGe region 56 covers less than the entire width of the P-active region 10P. This may be accomplished by controlling the size and location of the mask opening 50A such the Germanium is implanted into the desired location under in the active layer 10C. For example, the mask opening 50A may be sized such that the implanted SiGe region 56 will be positioned only under the gate electrode of the subsequently formed PMOS transistor, or it may be sized such that the implanted SiGe region 56 will be positioned under the gate electrode and one or more sidewall spacers of the subsequently formed PMOS transistor. To the extent that the implanted SiGe region 56 is formed as illustratively depicted in FIG. 2D, wherein the implanted SiGe region 56 is formed across the entirety of the exposed P-active region 10P, the portions of the implanted SiGe region 56 that extend any significant distance beyond the gate-length of the gate electrode (that is to be formed) do not adversely impact the ability of the implanted SiGe region 56 in the area under the gate electrode to assist in adjusting and controlling the threshold voltage of the subsequently formed PMOS transistors. Moreover, the presence of such implanted SiGe regions 56 between the sidewall spacers of the PMOS transistor and the isolation region 12 do not appear to have any adverse impact of the formation of metal silicide regions on the source-drain regions of the PMOS device or on the operation of the source-drain regions themselves.

As will be recognized by those skilled in the art after a complete reading of the present application, the novel methods disclosed herein may be employed in various processing schemes. For example, the illustrative methods disclosed herein may be employed in either a "gate-first" or a "gate-last" processing technique. The conductive gate electrode structures of the NMOS transistor and/or the PMOS transistor may be made of any conductive material, such as metal or polysilicon. Thus, the present invention should not be considered as limited to any illustrative process flow or details described herein. Additionally, if desired, the methods disclosed herein could also be employed with PMOS devices have embedded SiGe regions, such as those briefly discussed in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a P-active region and an N-active region in a semiconducting substrate comprising silicon;
   forming a masking layer that covers said N-active region and exposes the P-active region;
   with the masking layer in position, forming an implantation screen layer on said exposed P-active region;
   with the masking layer in position, performing an ion implantation process through said implantation screen layer to implant germanium into said P-active region to form an implanted silicon-germanium region in said P-active region, wherein performing said ion implantation process to implant germanium comprises performing said ion implantation process at an energy level ranging from 1-10 KeV with an implant dosage that ranges from $1e^{14}$-$1e^{15}$ ions/cm$^2$ of germanium;
   after performing said ion implantation process, removing said masking layer and said implantation screen layer so as to expose an upper surface of said P-active region; and
   forming a gate insulation layer of a gate electrode structure for a PMOS transistor on said exposed upper surface of said P-active region and on said implanted silicon-germanium region.

2. The method of claim 1, wherein said implanted silicon-germanium region has a thickness ranging from approximately 3-10 nm.

3. The method of claim 1, wherein said implantation screen layer comprises silicon dioxide.

4. The method of claim 1, wherein said implanted silicon-germanium region has a width that is less than an entire width of the P-active region and substantially equal to a gate-length of said PMOS transistor.

5. The method of claim 1, wherein said implanted silicon-germanium region extends across an entirety of said P-active region that is defined by at least one isolation structure formed in substrate.

6. The method of claim 1, further comprising performing at least one heat treatment process on said implanted silicon-germanium region.

7. A method, comprising:
  forming a P-active region and an N-active region in a semiconducting substrate comprising silicon;
  forming a masking layer that covers said N-active region and exposes at least a portion of said P-active region;
  with the masking layer in position, forming an implantation screen layer on said exposed portion of said P-active region;
  with the masking layer in position, performing an ion implantation process through said implantation screen layer to implant germanium into said P-active region to form an implanted silicon-germanium region in said exposed portion of said P-active region, wherein performing said ion implantation process to implant germanium comprises performing said ion implantation process at an energy level ranging from 1-10 KeV with an implant dosage that ranges from 1e14-1e15 ions/cm2 of germanium and wherein said implanted silicon-germanium region has a thickness ranging from approximately 3-10 nm;
  after performing said ion implantation process, removing said masking layer and the implantation screen layer so as to expose an upper surface of said P-active region; and
  forming a gate insulation layer of a gate electrode structure for a PMOS transistor on said exposed upper surface of said P-active region and on said implanted silicon-germanium region.

8. The method of claim 7, wherein said implanted silicon-germanium region has a width that is less than an entire width of the P-active region and substantially equal to a gate-length of said PMOS transistor.

9. The method of claim 7, wherein said implanted silicon-germanium region extends across an entirety of said P-active region that is defined by at least one isolation structure formed in substrate.

10. A method, comprising:
  forming a P-active region and an N-active region in a semiconducting substrate comprising silicon;
  forming a masking layer that covers said N-active region and exposes at least a portion of said P-active region;
  with the masking layer in position, forming an implantation screen layer comprised of silicon dioxide on said exposed portion of said P-active region;
  with the masking layer in position, performing an ion implantation process through said implantation screen layer to implant germanium into said P-active region to form an implanted silicon-germanium region having a thickness ranging from approximately 3-10 nm in said P-active region, said ion implantation process being performed at an energy level ranging from 1-10 KeV with an implant dosage that ranges from $1e^{14}$-$1e^{15}$ ions/cm$^2$ of germanium;
  after performing said ion implantation process, removing said masking layer and said implantation screen layer so as to expose an upper surface of said P-active region;
  forming a gate insulation layer of a gate electrode structure for a PMOS transistor on said exposed upper surface of said P-active region and on said implanted silicon-germanium region; and
  performing at least one heat treatment process on said implanted silicon-germanium region.

11. The method of claim 10, wherein said implanted silicon-germanium region has a width that is less than an entire width of the P-active region and substantially equal to a gate-length of said PMOS transistor.

12. The method of claim 10, wherein said implanted silicon-germanium region extends across an entirety of said P-active region that is defined by at least one isolation structure formed in substrate.

* * * * *